United States Patent [19]

Schwendt

[11] Patent Number: 5,048,016

[45] Date of Patent: Sep. 10, 1991

[54] CIRCUIT CONFIGURATION FOR INCREASING THE OUTPUT VOLTAGE OF AN ELECTRONIC SWITCHING STAGE

[75] Inventor: Ralf Schwendt, Düsseldorf, Fed. Rep. of Germany

[73] Assignee: Siemens Aktiengesellschaft, Munich, Fed. Rep. of Germany

[21] Appl. No.: 579,046

[22] Filed: Sep. 7, 1990

[30] Foreign Application Priority Data

Sep. 7, 1989 [EP] European Pat. Off. ........ 89116559.9

[51] Int. Cl.⁵ .................... H03K 19/096; H03K 17/60
[52] U.S. Cl. ..................................... 307/570; 307/482
[58] Field of Search .............. 307/570, 246, 482, 578, 307/296.2

[56] References Cited

U.S. PATENT DOCUMENTS

| | | | |
|---|---|---|---|
| 4,468,576 | 8/1984 | Takemae | 307/578 |
| 4,542,310 | 9/1985 | Ellis et al. | 307/482 |
| 4,628,218 | 12/1986 | Nakaizumi | 307/578 |
| 4,638,182 | 1/1987 | McAdams | 307/578 |
| 4,644,190 | 2/1987 | Eberhard et al. | 307/482 |

FOREIGN PATENT DOCUMENTS 0297844 1/1989 European Pat. Off. .

OTHER PUBLICATIONS

IBM Technical Disclosure Bulletin, vol. 18, No. 3, Aug. 1975; pp. 910-911, New York, U.S.: M. E. Homan: "FET Depletion Load Push-Pull Logical Circuit"; p. 910, line 11-p. 911, line 10; Figure.

Primary Examiner—David Hudspeth
Assistant Examiner—Andrew Sanders
Attorney, Agent, or Firm—Herbert L. Lerner; Laurence A. Greenberg

[57] ABSTRACT

A circuit configuration includes a first electronic reversing switch having an output being superimposed on a first operating potential during a first switching phase and on a second operating potential during a second switching phase, as well as a second electronic reversing switch having an output being superimposed on the first operating potential during the first switching phase and on a node point during the second switching phase. A diode is connected in the conducting direction between the second operating potential and the node point. A capacitor is connected between the output of the first electronic reversing switch and the node point.

6 Claims, 1 Drawing Sheet

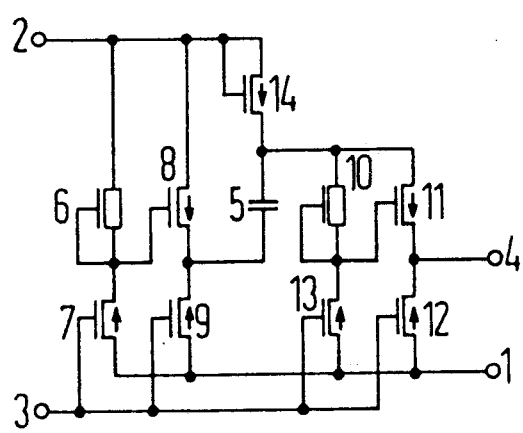

CIRCUIT CONFIGURATION FOR INCREASING THE OUTPUT VOLTAGE OF AN ELECTRONIC SWITCHING STAGE

The invention relates to a circuit configuration for increasing the output voltage of a electronic switching stage.

Statically clocked switching stages, particularly so-called transfer transistors, are often used in unipolar circuitry to switch signals at defined times. The amplitude of such a clock signal is generally quantitatively equal to the supply voltage. As a result, the maximum voltage rise available at the output of the transfer transistor is the voltage difference between the supply voltage and the cutoff voltage of the switching transistor. In many applications, however, it is desirable for the signal to be switched with a voltage rise that is equal to the supply voltage. So-called bootstrap output stages are often used, which are capable of increasing the voltage of the transfer transistor to a value greater than or equal to the supply voltage. Such bootstrap output stages are known, for instance, from the book entitled Integrierte MOS-Schaltungen ÄIntegrated MOS CircuitsÜ, by H. Weiβand K. Horninger, 1st Edition 1982, pp. 169 et seq.

According to preferred embodiments of known bootstrap output stages, in a first switching phase of the clock pulse being supplied, a capacitor is precharged (precharging phase) through an electronic switch to the supply voltage, minus the cutoff voltage of the electronic switch. With a non-overlapping further clock pulse, the reference potential of the capacitor is raised from a first operating potential to a second operating potential simultaneously with the shutoff of the electronic switch, with the supply voltage being equal to the second operating potential, plus the second operating potential. As a result, in the most favorable case, twice the value of the supply voltage is available at the output of the circuit. However, it is problematic that during the precharging phase, the entire charge voltage is present at the output, causing subsequent circuits to be triggered before the desired instant, so that undesirable currents flow.

It is accordingly an object of the invention to provide a circuit configuration for increasing the output voltage of an electronic switching stage, which overcomes the hereinafore-mentioned disadvantages of the heretofore-known devices of this general type and in which n precharging phase is necessary.

With the foregoing and other objects in view there is provided, in accordance with the invention, a circuit configuration, comprising a node point, a first electronic reversing switch having an output being superimposed on or connected to a first operating potential during a first switching phase and on a second operating potential during a second switching phase; a second electronic reversing switch having an output being superimposed on or connected to the first operating potential during the first switching phase and on the node point during the second switching phase; a diode connected in the conducting direction between the second operating potential and the node point; and a capacitor connected between the output of the first electronic reversing switch and the node point.

In accordance with another feature of the invention, the electronic reversing switches each include a respective a push-pull stage having two transistors with input sides, and a respective inverter stage is connected to the input side of one of the two transistors.

In accordance with a further feature of the invention, the inverter stages each include a third transistor having a load circuit, and a fourth transistor being connected into the load circuit and being operated as a current source.

In accordance with an added feature of the invention, all of the transistors are MOSFETs.

In accordance with a concomitant feature of the invention, the fourth transistor is a depletion MOSFET.

Among the advantages of the invention are that the capacitor has a lower capacitance than in the known configuration, since the output is decoupled during the charging phase, and that (because of the lower capacitance) the pulses present at the output have steeper edges. The low power consumption and the low expenditure for circuitry are also advantageous.

Other features which are considered as characteristic for the invention are set forth in the appended claims.

Although the invention is illustrated and described herein as embodied in a circuit configuration for increasing the output voltage of an electronic switching stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a schematic circuit diagram of an exemplary embodiment of the invention.

Referring now to the single figure of the drawing in detail, there is seen a first electronic reversing switch, having transistors 6-9; a second electronic reversing switch, having transistors 10-13; a diode 14; and a capacitor 5, which are provided according to the invention. The output of the first reversing switch is superimposed on a or connected to negative first operating potential 1 during a first switching phase specified by a clock signal 3 and is superimposed on or connected to a positive second operating potential 2 during a second switching phase dictated by the clock signal 3. The output of the first reversing switch and a node point at which the second operating potential 2 is applied through the diode 14 in the conducting direction, are joined together by the capacitor 5. The output of the second reversing switch, at which an output signal 4 of the entire circuit configuration is present, is superimposed on the first operating potential 1 during the first switching phase and is superimposed on the node point during the second switching phase.

According to a feature of the invention, each of the two reversing switches has one push-pull stage each having two respective drain-coupled enhancement MOSFETs 8 and 9 as well as 11 and 12 of the n-channel type. The gate terminals of the transistors 9 and 12 are connected directly to the clock signal 3, while the source terminals thereof are connected to the first operating potential 1. The gate terminals of the transistors 8 and 11 are each connected through an inverter stage to the clock signal 3, while the source terminals thereof are connected to the second operating potential 2. In each inverter stage, one respective enhancement MOSFET 7 or 13 of the n-channel type each is provided. The source terminals of the enhancement MOSFETs 7, 13 are connected to the first operating potential 1 and the gate terminals thereof are acted upon by the clock signal 3. The drain terminals of the enhancement MOSFETs 7, 13 are each connected firstly to the gate terminal of a respective one of the transistor 8, 11, and secondly to the second operating potential 2 through a respective depletion MOSFET 6, 10. According to the invention, the depletion MOSFETs 6, 10 have interconnected gate and drain terminals and they are operated as a current source. The respectively coupled drain terminals of the transistors 8 and 9 as well as 11 and 12 are provided as outputs of the inverter stages. Finally, in the present exemplary embodiment, the diode 14 is constructed as a transistor of the n-channel type having source and gate terminals being connected to one another.

The voltage rise of the output signal 4 is thus equal to twice the value of the supply voltage minus the cutoff voltage of the transistors 8, 9, 11 and of the diode 14. During the charging phase of the capacitor 5, the output of the circuit configuration is decoupled by the transistor 11, and as a result the load at the output has no influence on the charging of the capacitor 5. The capacitor can therefore have a lower capacity, and as a result a lower charge current and more rapid charging are assured.

Furthermore, the power consumption is lowered further by limiting cross currents by means of the relatively high-impedance depletion MOSFETs 6 and 10. Additionally, a signal delay brought about by the transistors 6-9 prevents discharging with the transistors 10 and 13 at the instant of shutoff of the capacitor 5 through the opened current path, which likewise reduces the power consumption. Besides the lower power consumption, other particular advantages can be named, in particular steeper leading and trailing edges and the fact that less space is required, which facilitates integration of such a circuit configuration.

I claim:

1. Circuit configuration, comprising a node point, a first electronic reversing switch having an output being coupled to a first operating potential during a first switching phase and to a second operating potential during a second switching phase; a second electronic reversing switch having an output being coupled to the first operating potential during the first switching phase and to said node point during the second switching phase; a diode connected in the conducting direction between the second operating potential and said node point; and a capacitor connected between the output of said first electronic reversing switch and said nod point.

2. Circuit configuration according to claim 1, wherein said electronic reversing switches each include a respective push-pull stage having two transistors with respective gates, and a respective inverter stage is connected to the gate of one of said two transistors.

3. Circuit configuration according to claim 2, wherein said inverter stages each include a third transistor having a load circuit, and a fourth transistor being connected into the load circuit and being operated as a current source.

4. Circuit configuration according to claim 2, wherein all of said transistors are MOSFETs.

5. Circuit configuration according to claim 3, wherein all of said transistors are MOSFETs.

6. Circuit configuration according to claim 5, wherein said fourth transistor is a depletion MOSFET.

* * * * *